(12) United States Patent
Knerer et al.

(10) Patent No.: US 9,249,525 B2
(45) Date of Patent: Feb. 2, 2016

(54) RING-SHAPED RESISTANCE HEATER FOR SUPPLYING HEAT TO A GROWING SINGLE CRYSTAL

(75) Inventors: Dieter Knerer, Haiming (DE); Werner Schachinger, Simbach (DE)

(73) Assignee: SILTRONIC AG, Munich (DE)

( * ) Notice: Subject to any disclaimer, the term of this patent is extended or adjusted under 35 U.S.C. 154(b) by 443 days.

(21) Appl. No.: 13/545,097

(22) Filed: Jul. 10, 2012

(65) Prior Publication Data

US 2013/0014695 A1 Jan. 17, 2013

(30) Foreign Application Priority Data

Jul. 15, 2011 (DE) .......................... 10 2011 079 284

(51) Int. Cl.
| | |
|---|---|
| C30B 15/16 | (2006.01) |
| C30B 15/14 | (2006.01) |
| C30B 30/04 | (2006.01) |
| C30B 35/00 | (2006.01) |
| H05B 3/40 | (2006.01) |

(52) U.S. Cl.
CPC ................. *C30B 15/14* (2013.01); *C30B 30/04* (2013.01); *C30B 35/00* (2013.01); *H05B 3/40* (2013.01); *Y10T 117/1068* (2015.01)

(58) Field of Classification Search
CPC ...... C30B 11/003; C30B 13/16; C30B 13/22; C30B 15/14; C30B 15/16; Y10T 117/00; Y10T 117/10; Y10T 117/1016; Y10T 117/1024; Y10T 117/1068

USPC ............ 117/200, 204, 206, 208, 217; 219/50, 219/59.1, 61.1, 62, 200, 201, 209, 210, 236
See application file for complete search history.

(56) References Cited

U.S. PATENT DOCUMENTS

| | | | |
|---|---|---|---|
| 5,698,029 A * | 12/1997 | Fujikawa et al. ............. | 117/204 |
| 5,766,347 A | 6/1998 | Shimomura et al. | |
| 5,769,944 A * | 6/1998 | Park et al. ..................... | 117/223 |
| 6,132,507 A | 10/2000 | von Ammon et al. | |
| 6,287,382 B1 * | 9/2001 | Cherko ......................... | 117/208 |
| 7,335,864 B2 * | 2/2008 | Peck et al. ..................... | 219/674 |
| 2004/0192015 A1 | 9/2004 | Ammon et al. | |
| 2005/0087125 A1 * | 4/2005 | Muhe et al. ................... | 117/200 |
| 2009/0032519 A1 * | 2/2009 | Schlipf ......................... | 219/209 |
| 2009/0133617 A1 * | 5/2009 | Iida et al. ........................ | 117/35 |
| 2011/0214604 A1 | 9/2011 | Takano | |

FOREIGN PATENT DOCUMENTS

| | | |
|---|---|---|
| EP | 1 538 242 A1 | 6/2005 |
| JP | 09208371 A | 8/1997 |
| JP | 10003982 A | 1/1998 |
| JP | 2010-132500 A | 6/2010 |
| WO | 2005/041278 A2 | 5/2005 |
| WO | 2008/155138 A2 | 12/2008 |

* cited by examiner

*Primary Examiner* — Kenneth A Bratland, Jr.
(74) *Attorney, Agent, or Firm* — Brooks Kushman P.C.

(57) ABSTRACT

A ring-shaped resistance heater for supplying heat to a growing single crystal, contains an upper and a lower ring, which are electrically conductively connected by means of a loop adjacent to a ring gap of one ring, such that the flow direction of electric current which is conducted through the rings is opposite in the rings; connecting elements which hold the upper and lower rings together in a spaced apart relationship; and current leads for conducting electric current through the upper and lower rings.

20 Claims, 4 Drawing Sheets

RING-SHAPED RESISTANCE HEATER FOR SUPPLYING HEAT TO A GROWING SINGLE CRYSTAL

CROSS-REFERENCE TO RELATED APPLICATIONS

This application claims priority to Germany Patent Application No. DE 10 2011 079 284.8 filed Jul. 15, 2011, which is herein incorporated by reference.

BACKGROUND OF THE INVENTION

1. Field of the Invention

The invention relates to a ring-shaped resistance heater for supplying heat to a growing single crystal.

2. Background Art

One method for producing single crystals is the Czochralski method. It is employed, for example, for producing single crystals composed of silicon. In accordance with this method, firstly a melt is produced in a crucible, then a seed crystal is brought into contact with the melt and, finally, a single crystal suspended from the seed crystal is caused to grow by the seed crystal being pulled upward from the surface of the melt.

It is advantageous if heat can be supplied to the growing single crystal by means of a ring-shaped resistance heater, which is also called a ring heater hereinafter. Thus, US 2004/0192015 describes a method wherein heat is supplied to the phase boundary of the growing single crystal by means of a ring heater in order to homogenize the axial temperature gradients at the phase boundary along the radius of the single crystal. The aim of the measure is to influence the formation of intrinsic point defects to the effect that the defect properties of the grown single crystal are as uniform as possible in a radial direction.

U.S. Pat. No. 6,132,507 mentions that a ring heater can also be used to reduce fluctuations of the diameter of the single crystal and the growth rate.

The inventors of the present invention have ascertained that the use of a ring heater for supplying heat to a growing single crystal poses difficulties if, at the same time, a strong external magnetic field is built up in order to influence the flow in the melt. An electromagnetic interaction between the external magnetic field and the magnetic field generated by the ring heater occurs in such a case. The Lorentz force acting on the ring heater can alter the position of the ring heater, damage the ring heater or even destroy the latter.

U.S. Pat. No. 7,335,864 B2 describes the fact that the inherent magnetic field of a resistance heater can be reduced by a heating coil being wound in a bifilar fashion, such that the electric current flows in opposite directions through the partial turns of the heating coil. However, despite the use of a ring heater modified in this way, the difficulties mentioned cannot be eliminated satisfactorily because the interaction between the magnetic fields remains, albeit in weakened form.

SUMMARY OF THE INVENTION

Therefore, the object of the present invention is to provide a ring-shaped resistance heater for supplying heat to a growing single crystal which has the advantages of the ring heater described in US 2004/0192015 A1 without having the disadvantages thereof during use in the presence of a strong external magnetic field. These and other objects are achieved by means of a ring-shaped resistance heater for supplying heat to a growing single crystal, comprising an upper and a lower ring, which are electrically conductively connected by means of a loop adjacent to a ring gap of the lower ring, such that the flow direction of electric current which is conducted through the rings is opposite in the rings;

connecting elements which hold the upper and lower rings together at a distance; and current leads for conducting electric current through the upper and lower rings.

BRIEF DESCRIPTION OF THE DRAWINGS

The invention is explained in greater detail below with reference to figures. The figures show particularly preferred configuration features of the ring heater.

DETAILED DESCRIPTION OF THE PREFERRED EMBODIMENT(S)

Figure 1:
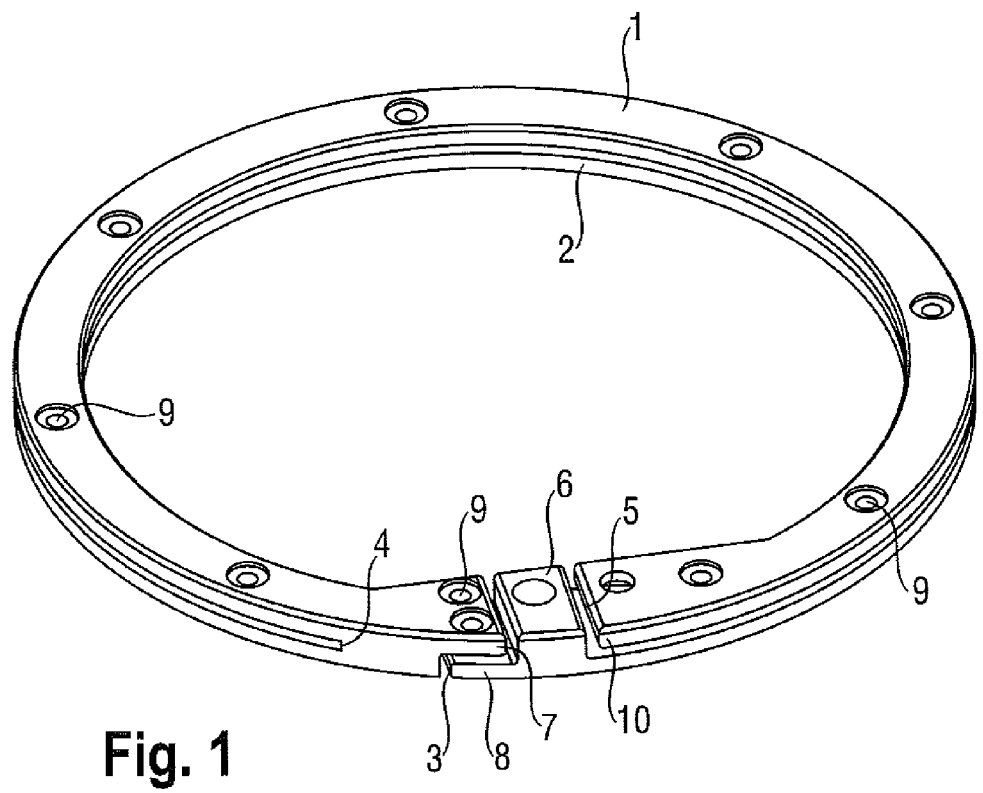
FIG. 1 shows the ring heater without connecting elements and without current leads in a perspective illustration.

The ring heater of the present invention comprises two ring-shaped partial coils arranged one above the other, said partial coils also being designated hereafter as upper and lower rings and being connected by means of a loop to form an integral component. The flow direction of electric current that flows through the partial coils reverses when passing through the loop. The ring heater thus has the structure and properties of a coil wound in bifilar fashion.

Preferably, the upper and lower rings and the current leads consist substantially of carbon, for example carbon fiber reinforced carbon (CFC) or graphite. Graphite is particularly preferred, in particular a graphite type having the lowest possible resistivity, the highest possible flexural strength and the highest possible thermal conductivity. In order that the area of the cross section of the rings can be as small as possible, the resistivity should preferably be not more than 11 $\mu\Omega$m. The flexural strength should preferably be not less than 50 MPa, and the thermal conductivity should preferably be not less than 120 W/mK. The high thermal conductivity prevents a formation of overheated locations ("hot spots") that accelerate the wear of the ring heater.

Connecting elements hold the upper and lower rings together and at a specific distance from one another. They thereby compensate for electromagnetic forces which act on the rings, and prevent, in particular, the rings from being displaced relative to one another under the influence of a magnetic field acting on the melt. The distance between the rings is preferably not less than 2 mm and not more than 150 mm. A distance smaller than 2 mm is not preferred, owing to the risk of electrical flashovers occurring, and a distance greater than 150 mm is likewise not preferred either, because then the advantages of the bifilar structure of the ring heater are no longer adequately manifested. The connecting elements can be embodied in such a way that, at the connecting locations, the upper ring is electrically insulated from the lower ring. Equally, the connecting elements can be embodied in such a way that they conduct away part of the electric current flowing through the rings. Said part should in each case be not more than 5% of the total electrical power. A configuration of this type can be achieved, for example, by the upper and lower rings being screwed to each other directly by means of a screw composed of carbon fiber reinforced carbon (CFC).

The upper ring and the lower ring are carried by current leads fixed to the upper and lower rings, respectively. It is preferred to connect the current leads to one another in an electrically insulated manner and to secure them in this way against a force which compresses them or pulls them apart and which is brought about by a strong external magnetic field. The stronger external magnetic field is, for example, a horizontal magnetic field or a cusp magnetic field that is impressed on the melt.

It is preferred to embody the upper and lower rings in a widened fashion in the region of the fixing locations of the current leads. This strengthens the mechanical stability of the rings in this region and reduces the current density, such that local overheating is avoided.

The ring heater is used to supply heat to a growing single crystal, preferably for the purpose of influencing the radial profile of the axial temperature gradient at the phase boundary of the growing single crystal and for regulating the diameter of the growing single crystal. The single crystal is preferably a single crystal composed of silicon having a diameter of not less than 300 mm, more preferably having a suitable diameter for the production of 300 mm or 450 mm wafers.

The ring heater in accordance with FIG. 1 comprises an upper ring 1 and a lower ring 2, wherein both rings are interrupted by ring gaps, which are arranged in an offset manner. The ring gap 3 of the lower ring is adjacent to a loop 4, which connects the upper ring 1 to the lower ring 2. The ring gap 5 of the upper ring is preferably wide enough in order that there is space for fixing the current lead of the lower ring. Preferably, there is space for a base 6, which increases the thickness of the lower ring in the region of the base, such that the fixing locations of the current leads are situated at the same level.

Owing to the offset arrangement of the ring gaps, an end 7 of the upper ring and an end 8 of the lower ring overlap in the region between the base 6 and the ring gap 3 of the lower ring. The edges of the upper ring and of the lower ring, in particular the edges at the outer circumference and at the inner circumference of the rings, are rounded. Rounding the edges reduces the risk of electrical flashovers occurring.

On the end sides of the rings, holes 9 are distributed over the circumference, said holes leading congruously in the thickness direction through the upper and lower rings. The holes are preferably distributed centrally and at identical distances on the end sides in order to avoid asymmetries. They are preferably situated, in particular, also at locations at which the rings are subjected to particularly high mechanical loading. Where the end 7 of the upper ring and the end 8 of the lower ring overlap, holes 9 lying radially alongside one another are present instead of centrally arranged holes. Holes for fixing the rings to current leads are situated on the end side of the base 6 and on the end side of a further end 10 of the upper ring 1.

It is preferred to widen the rings in the region of their ends and in the region of the base 6 in order to increase the mechanical stability and reduce the current densities there.

Figure 2:
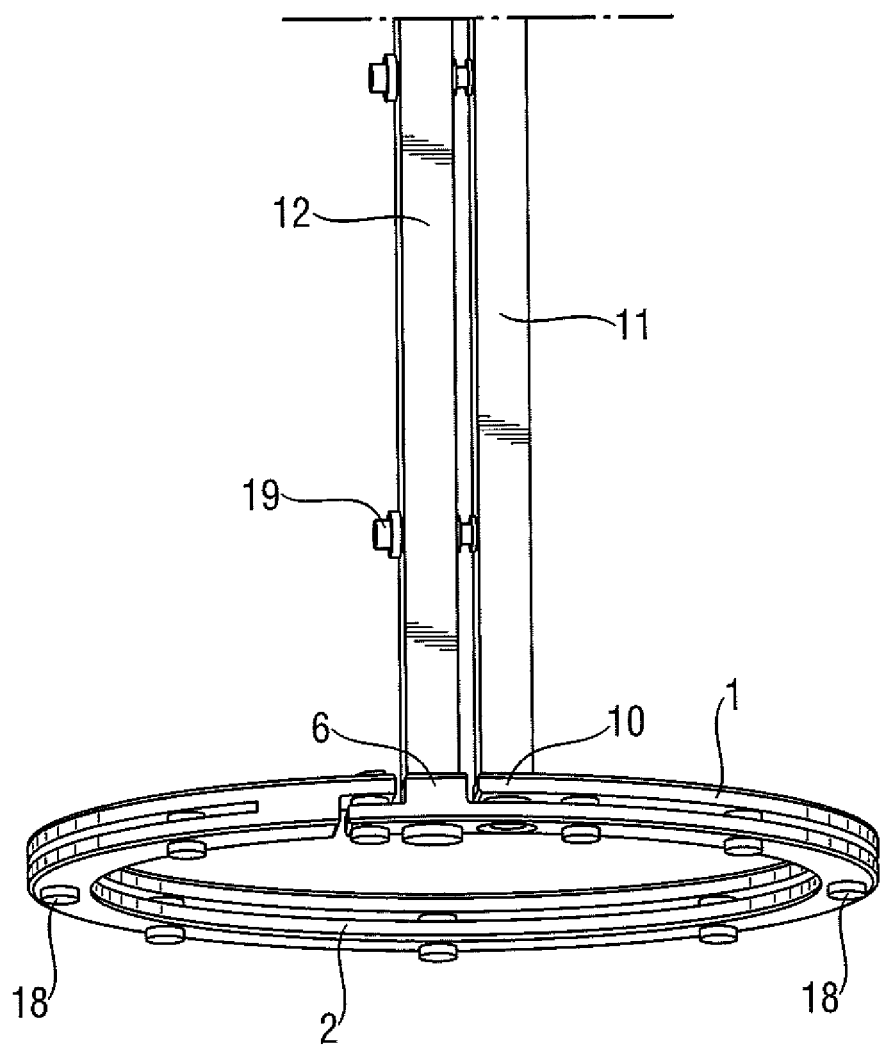
FIG. 2 shows the ring heater in accordance with FIG. 1 with the connecting elements and the current leads in a perspective illustration.

FIG. 2 reveals that the holes serve for the most part for accommodating connecting elements 18, which position the upper ring and the lower ring with respect to each other, to be precise at a specific distance and such that they are electrically insulated from one another, or in such a way that the connecting elements form a high-impedance line between the rings. The hole on the end side at the end 10 of the upper ring and the hole on the end side of the base 6 serve for fixing the upper ring 1 to a current lead 11 of the upper ring and for fixing the lower ring 2 to a current lead 12 of the lower ring. The base 6 increases the thickness of the lower ring 2 preferably in such a way that the rings are fixed to the current leads at locations at the same level.

In the case of the ring heater illustrated in FIG. 2, the current lead 11 of the upper ring and the current lead 12 of the lower ring are connected to one another by means of a clamping connection 19 at at least one location. The clamping connection 19 secures the current leads against an electromagnetic force of a strong external magnetic field, said force compressing said current leads. In addition or instead of the clamping connection 19, it is possible to provide one or a plurality of connections of the current leads which secure the current leads against an electromagnetic force of a strong external magnetic field, said force forcing apart said leads.

Figure 3:
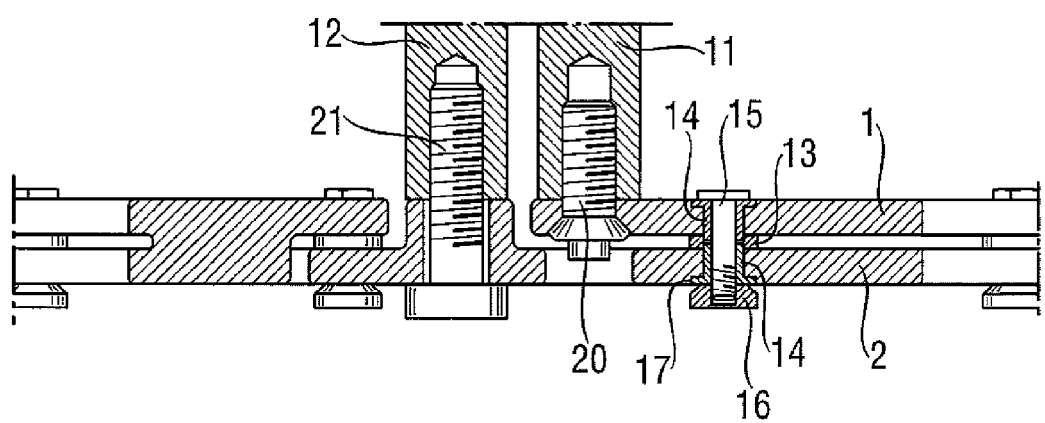
FIG. 3 is a sectional illustration through the ring heater in the region of the current leads.

In accordance with FIG. 3, the connecting elements 18 preferably comprise in each case a ring-shaped spacer 13, hollow cylinders 14, a screw 15 and a screw nut 16. The diameter of the hollow cylinders 14 is preferably widened at one end by a collar 17. The ring-shaped spacer 13 is arranged between the rings. The hollow cylinders are inserted through the holes and line the latter. The screw 15, which extends through the hollow cylinders 14 and the spacer 13, is screwed at its end to the screw nut 16. The screw nut is preferably closed by a blind hole.

During assembly, firstly the ring-shaped spacer 13 is pushed between the upper ring 1 and the lower ring 2 and then a hollow cylinder 14 is inserted through the hole in the upper ring into the spacer. A further hollow cylinder 14 is then inserted through the lower ring 2 into the spacer and the arrangement is screwed together with the screw 15 and the screw nut 16. In order to save structural height, the collars 17 of the hollow cylinders 14 are countersunk into the end side of the upper ring 1 and into the opposite side of the end side of the lower ring 2.

The hollow cylinders 14 and the ring-shaped spacer 13 consist of a temperature-resistant and electrically insulating material, preferably of boron nitride.

The screw 15 and the screw nut 16 consist of a temperature-resistant material that is resistant to tensile, shear and torsional loading, preferably of carbon fiber reinforced carbon (CFC).

The ring-shaped spacer 13 absorbs compressive forces that compress the rings under the action of a strong external magnetic field, and the screw 15 absorbs tensile forces that pull the rings apart under the action of a strong external magnetic field.

The current lead 11 of the upper ring 1 conducts a comparatively high current density into the upper ring. The fixing means for fixing the upper ring 1 to the current lead 11 should therefore be temperature-resistant and have a comparatively low resistivity. It is therefore preferred to fix the upper ring to the current lead 11 using a screw 20 composed of graphite. Furthermore, it is advantageous, in order to enlarge the contact area, to form the screw 20 as a countersunk screw.

The current lead 12 of the lower ring 2 carries a large part of the weight of the ring heater. The fixing means for fixing the lower ring 2 to the current lead 12 should therefore be temperature-resistant and have a comparatively high mechanical stability. It is therefore preferred to fix the lower ring to the current lead 12 using a screw 21 composed of carbon fiber reinforced carbon (CFC).

Figure 4:
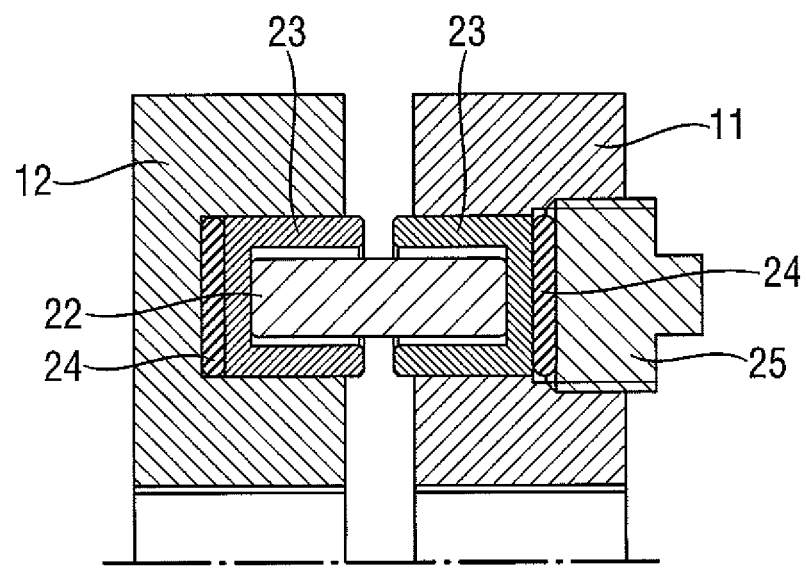
FIG. 4 is a sectional illustration through the current leads in the region of the clamping connection.

In accordance with FIG. 4, the clamping connection 19 comprises a pin 22, which is arranged transversally with respect to the longitudinal direction of the current lead 11 of the upper ring and the current lead 12 of the lower ring and over which electrically insulating mounts 23 are slipped. The mounts 23 are placed with washers 24 in holes in the current leads and are held in position by a screw 25. The pin 22 and the washers 24 preferably consist of carbon fiber reinforced carbon (CFC), and the mounts 23 preferably consist of boron nitride.

EXAMPLE

The mechanical stability of a ring heater comprising the features of the illustrations in FIGS. 1 to 4 was tested under conditions such as occur in the method described in US 2004/0192015 A1. With comparable performance, a lower susceptibility of the ring heater to wear and faults was found in comparison with the ring heater described in that document. Furthermore, the ring heater described in that document was able to be replaced by the ring heater according to the invention without necessitating structural alterations on the apparatus for producing single crystals.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A flat, ring-shaped resistance heater suitable for supplying heat to a growing single crystal, comprising first and second flat rings, each ring having an outer circumference and an inner circumference defining respective outer and inner edges, the edges optionally rounded; the outer and inner optionally rounded edges connected by annular planar surfaces,
   wherein each ring is interrupted by a ring gap, and the upper and lower rings are spatially and electrically separated from each other except at a loop portion proximate a ring gap of one ring, such that a flow direction of electric heating current in the first ring is opposite the flow direction of electric heating current in the second ring, the annular planar surfaces forming on each ring an outward annular planar surface facing away from the other ring, and an oppositely facing annular planar surface facing toward the other ring;
   a plurality of insulative ring connecting elements spaced circumferentially along the annular planar surfaces of the first and second rings, the insulative ring connecting elements securing the upper and lower rings together but spatially separated and restricting movement of the upper and lower rings towards each other or away from each other;
   at least one insulative end connecting element proximate said loop portion and located on the annular planar surfaces of the first and second rings, securing the first and second rings to each other in an insulative fashion;
   a first current lead attached to said first ring proximate the gap in the first ring;
   a second current lead attached to said second ring proximate the gap in the second ring;
   wherein the first and second current leads are secured to each other by at least one insulative current lead connecting element which restricts movement of said first and second current leads towards or away from each other in the presence of an external magnetic field, and
   wherein all insulative connecting elements are composed of an insulating material or a material which provides a high impedance to the flow of electrical current.

2. The flat, ring-shaped resistance heater of claim 1, wherein an end of the annular planar surface of the first ring proximate a ring gap in the first ring overlaps an end of the annular planar surface of the second ring proximate a ring gap in the second ring, and the insulative end connecting element(s) secure the first and second rings to each other in an area of overlap.

3. The flat, ring-shaped resistance heater of claim 2, wherein the ring gap of the first ring is a gap having a width sufficient to accommodate in insulative fashion, a raised portion of the second ring, the first and second rings secured to each other by the insulative end connecting element(s) between the annular planar surface of the first and second rings on one side of the raised portion, and a further insulative connecting element between the annular planar surfaces on the other side of the raised portion, the further insulative connecting element also serving to connect said first current lead to said first ring.

4. The flat, ring-shaped resistance heater of claim 1, wherein a width of the first ring and of the second ring is increased in an area which receives the end insulative connecting element(s) and said first and second current leads.

5. The flat, ring-shaped resistance heater of claim 3, wherein a top surface of said raised portion is level with the outward planar annular surface of said first ring.

6. The flat, ring-shaped resistance heater of claim 1, wherein said first current lead and said second current leads rise vertically from the first and second rings in a parallel relationship.

7. The flat, ring-shaped resistance heater of claim 1, wherein the vertical first and second current leads are mechanically connected in insulating fashion by at least two insulative current lead connecting elements.

8. The flat, ring-shaped resistance heater of claim 1, wherein the insulative ring connecting elements each comprise a ring-shaped spacer, hollow cylinders, a screw and a screw nut, wherein the ring-shaped spacer is arranged between the rings, the hollow cylinders line holes through the rings in a thickness direction, and the screw is screwed at its end to the screw nut and extends through the hollow cylinders and the spacer.

9. The flat, ring-shaped resistance heater of claim 8, wherein collars of the hollow cylinders are countersunk in side areas of the upper and lower rings.

10. The flat, ring-shaped resistance heater of claim 1, wherein the first and second rings are formed from a single piece of graphite or carbon fiber reinforced carbon.

11. The flat, ring-shaped resistance heater of claim 1, wherein the first current lead is fixed to the first ring by means of a screw comprised of graphite.

12. The flat, ring-shaped resistance heater of claim 1, wherein the second current lead is fixed to the second ring by means of a screw comprising CFC.

13. The flat, ring-shaped resistance heater of claim 1, wherein the ring heater is solely supported by said first and second current leads.

14. The flat, ring-shaped resistance heater of claim 1, wherein the insulative current lead connector elements comprise a pin arranged transversely with respect to a longitudinal direction of the current leads over which insulating mounts are slipped, and a screw which holds the mounts and the pin in position.

15. The flat, ring-shaped resistance heater of claim 1, wherein the outer edges and inner edges of said first and said second rings are rounded, leaving a portion of said annual planar surfaces between the rounded inner and outer edges.

16. The flat, ring-shaped resistance heater of claim 8, wherein the ring-shaped spacer and the hollow cylinders are constructed of a temperature resistant electrically insulating material.

17. The flat, ring-shaped resistance heater of claim 8, wherein the ring shaped spacer and the hollow cylinders are constructed of boron nitride.

18. The flat, ring-shaped resistance heater of claim 1, wherein said first and second flat rings are the only rings in the resistance heater.

19. A ring-shaped resistance heater for supplying heat to a growing single crystal comprising:
   a resistance element having a generally annular shape and including a pair of flat rings each of which of which has oppositely facing flat surfaces connected by outer and inner surfaces respectively facing radially outward and inward with respect to the heater;
   the flat rings having a first pair of adjacent ends, and at least one insulator that spaces and electrically isolates the first pair of adjacent ends of the flat rings to provide a pair of electrodes for the heater;
   the flat rings having a second pair of adjacent ends electrically connected to each other;
   at least one insulator that spaces and electrically isolates the first pair of adjacent ends of the flat rings from the second pair of adjacent ends of the flat rings; and
   a plurality of further insulators that space and electrically isolate the flat rings from each other at spaced locations between their first and second pairs of adjacent ends such that electrical voltage applied to the pair of electrodes provides electricity flow in opposite circumferential directions for heating, the plurality of insulators also connecting the flat rings to prevent the rings from moving with respect to each other in the presence of an external magnetic field.

20. The ring-shaped resistance heater of claim 19, further comprising two current leads for supplying electrical power to the ring heater, a first current lead fixed to one flat ring, and a second current lead fixed to a second flat ring, the current leads extending vertically from the plane of the ring heater, and secured against relative movement with respect to each other by at least one insulative clamp which mechanically fixes the current leads to each other in a spaced relationship.

* * * * *